United States Patent
Segaram et al.

(10) Patent No.: US 6,933,610 B2
(45) Date of Patent: Aug. 23, 2005

(54) METHOD OF BONDING A SEMICONDUCTOR DIE WITHOUT AN ESD CIRCUIT AND A SEPARATE ESD CIRCUIT TO AN EXTERNAL LEAD, AND A SEMICONDUCTOR DEVICE MADE THEREBY

(75) Inventors: Para Kanagasabai Segaram, Campbell, CA (US); Joseph Fjelstad, Maple Valley, WA (US); Belgacem Haba, Cupertino, CA (US)

(73) Assignee: Silicon Pipe, Inc., San Jose, CA (US)

( * ) Notice: Subject to any disclaimer, the term of this patent is extended or adjusted under 35 U.S.C. 154(b) by 0 days.

(21) Appl. No.: 10/370,422

(22) Filed: Feb. 19, 2003

(65) Prior Publication Data

US 2003/0205802 A1 Nov. 6, 2003

Related U.S. Application Data

(60) Provisional application No. 60/358,117, filed on Feb. 20, 2002, and provisional application No. 60/380,033, filed on May 6, 2002.

(51) Int. Cl.$^7$ ............................................... H01L 29/72
(52) U.S. Cl. .................. 257/778; 257/723; 257/672; 257/173; 438/110; 438/14; 438/15
(58) Field of Search ................................ 257/173, 778, 257/783, 723, 110, 14, 15

(56) References Cited

U.S. PATENT DOCUMENTS

| | | | | |
|---|---|---|---|---|
| 5,568,346 A | * | 10/1996 | Orchard-Webb | ............. 361/58 |
| 5,644,167 A | * | 7/1997 | Weiler et al. | ................ 257/777 |
| 5,771,140 A | | 6/1998 | Kim | |
| 5,859,758 A | | 1/1999 | Kim | |
| 5,862,031 A | * | 1/1999 | Wicker et al. | ............... 361/111 |
| 5,978,197 A | * | 11/1999 | Chan | ........................... 361/111 |
| 6,066,890 A | | 5/2000 | Tsui et al. | |
| 6,198,136 B1 | | 3/2001 | Voldman et al. | |
| 6,385,021 B1 | | 5/2002 | Takeda et al. | |
| 6,458,869 B1 | * | 10/2002 | Antonucci et al. | ........... 523/118 |
| 6,489,672 B2 | * | 12/2002 | Lin | ............................. 257/692 |
| 2004/0041168 A1 | * | 3/2004 | Hembree et al. | ............ 257/173 |

FOREIGN PATENT DOCUMENTS

JP 5-41409 * 2/1993 ................. 257/783

* cited by examiner

Primary Examiner—Jasmine J Clark
(74) Attorney, Agent, or Firm—Shemwell Gregory & Courtney LLP (57) ABSTRACT

In a semiconductor device having a semiconductor die without an ESD circuit and a separate ESD circuit and an external lead, the external lead is first bonded to the separate ESD circuit. Thereafter, the separate ESD circuit is bonded to the semiconductor die. As a result, in the process of bonding the semiconductor die, any ESD disturbance is absorbed by the ESD circuit. In addition, a semiconductor device such as a DDR DRAM memory device, has a chip carrier with a first surface having a plurality of leads and a second surface opposite to it with an aperture between them. A semiconductor die with a mounting surface and a bonding pad faces the second surface with the bonding pad in the aperture. An ESD circuit is mounted on the mounting surface in the aperture. A first electrical connector connects one of a plurality of leads to the ESD circuit and a second electrical connector connects the ESD circuit to the bonding pad.

20 Claims, 8 Drawing Sheets

METHOD OF BONDING A SEMICONDUCTOR DIE WITHOUT AN ESD CIRCUIT AND A SEPARATE ESD CIRCUIT TO AN EXTERNAL LEAD, AND A SEMICONDUCTOR DEVICE MADE THEREBY

This non-provisional application claims the priority of a Provisional Application Ser. No. 60/358,117 filed on Feb. 20, 2002 and a Provisional Application Ser. No. 60/380,033 filed on May 6, 2002, whose disclosures are incorporated herein in their entirety by reference.

TECHNICAL FIELD

The present invention relates to a method of bonding a semiconductor die without an ESD circuit and a separate ESD circuit to an external lead, and more particularly to a semiconductor device made thereby.

BACKGROUND OF THE INVENTION

In a semiconductor device, which has a semiconductor die having an integrated circuit thereon, it is well known to have an ESD circuit to protect the input/output signal of the integrated circuit from electrostatic discharge. Typically, the ESD circuit is integrated with the integrated circuit onto the same single semiconductor die.

In U.S. Pat. Nos. 6,198,136 and 6,066,890, the references disclose the ESD circuit being a separate circuit apart from a semiconductor die and packaged together in a single package to protect and enhance the performance of the integrated circuit die. See, for example, FIGS. 3–5 and column 3, lines 29–50 of U.S. Pat. No. 6,066,890. However, one of the shortcomings of these references is that the particular order by which the external leads are bonded or connected to the various circuits is not disclosed. This is important in that since the ESD circuit is removed from the integrated circuit die, the die is "exposed" to the harmful effects of ESD, during the bonding process.

Further, the references do not disclose particular structures of chip carriers and semiconductor dies that may be connected to the separate ESD circuit advantageously. In particular, such a structure would be useful for packaging a semiconductor die with the integrated circuit as memory circuits. Finally, the references do not disclose the use of separate ESD circuits with terminating resistors outside of the semiconductor die but part of the package of the semiconductor device. These and other shortcomings are overcome by the present invention.

Other relevant art includes U.S. Pat. Nos. 5,771,140; 6,385,021; and 5,859,758.

SUMMARY OF THE INVENTION

In the present invention, a method for bonding a semiconductor die without an ESD circuit and a separate ESD circuit to an external lead is disclosed. In the method of the present invention, the external lead is first bonded to the separate ESD circuit. Thereafter, the separate ESD circuit with the external lead bonded thereto is then bonded to the semiconductor die.

The present invention also relates to a semiconductor device which has a chip carrier, a semiconductor die, and an ESD circuit. The chip carrier has a first surface with a plurality of leads and a second surface opposite to the first surface, and an aperture between the first surface and the second surface. The semiconductor die has a mounting surface with a mounting pad thereon facing the second surface with the mounting pad in the aperture. The ESD circuit is on the mounting surface in the aperture. A first electrical connector connects one of the plurality of leads to the ESD circuit and a second electrical connector connects the ESD circuit to the mounting pad.

In addition, the present invention relates to a method of assembling a semiconductor device wherein a strip containing a plurality of ESD circuits is mounted on the mounting surface of the semiconductor die with the strip containing a plurality of ESD circuits mounted substantially adjacent to a plurality of rows of mounting pads of the semiconductor die.

Finally, the present invention relates to a semiconductor device which has a semiconductor die with an input pad, an ESD circuit electrically connected to the input pad, and a terminating resistor switchably connected to the input pad. The ESD circuit and the resistor are external to the die, but packaged in the same package. An external lead is connected to the input pad.

DETAILED DESCRIPTION OF THE INVENTION

Figure 1A:
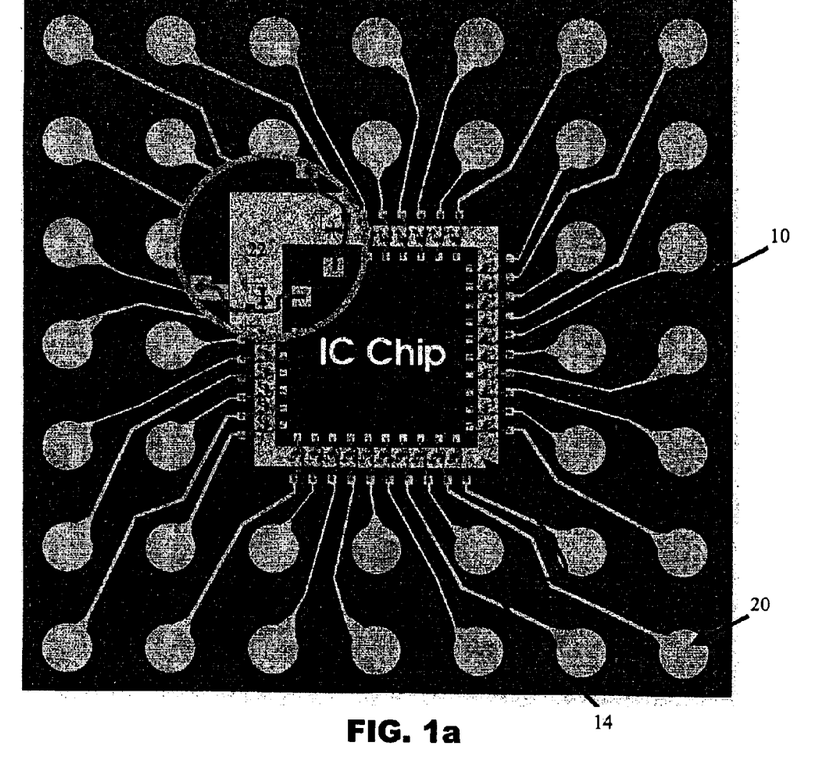
FIG. 1A is a top view of a first embodiment of an unpackaged semiconductor device manufactured by the method of the present invention, with FIG. 1B being a cross-sectional view of the device shown in FIG. 1A.
Figure 1B:
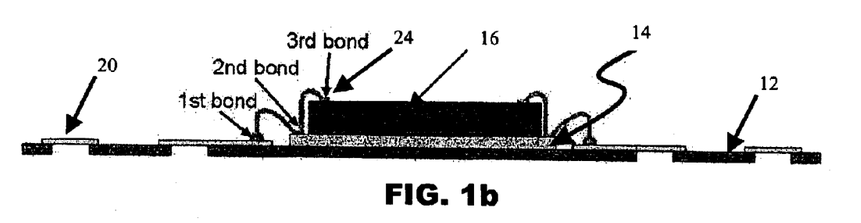

Referring to FIG. 1A and FIG. 1B there is shown a top view of an unpackaged semiconductor device 10 made in accordance with the method of the present invention. The device 10 comprises a semiconductor die or an integrated circuit chip 16. The chip 16 is typically substantially rectangular in shape having I/O pads 24 around the periphery or the perimeter thereof. The chip 16 can be any type of integrated circuit, such as memory, logic, processor, or analog. However, the chip or semiconductor die 16 does not have any ESD circuit associated with the input/output pads 24. The signals both input and output are supplied to the die 16 are supplied along these I/O pads 24. The die 16 is mounted on a glass substrate 14 which has a plurality of schottkey diodes 22 around its perimeter. Each of the schottkey diodes is well known in the art and provides the function of ESD protection. Finally, the glass substrate 14 with the schottkey diodes thereon is mounted on a chip carrier 12. The chip carrier 12 has a plurality of leads 20 which are electrical connections to various pins from which the packaged device 10 would supply signals and/or power to or from the device 10. Typically, the die 16 is mounted on the glass 14 by a die adhesive with the glass substrate 14 attached to the chip carrier 12 also by die adhesive.

In the method of the present invention, wire bonds are provided to electrically connect the external leads 20 to the schottkey diode 22 on the glass substrate 14 and to the bonding pads 24 on the semiconductor die 16. In particular, a first wire bond having a first end and a second end is first used to connect the external lead 20 to the schottkey diode 22. More particularly, the first end of the wire bond is first attached to the external lead 20. The second end of the first wire bond is then attached to the schottkey diode 22. Then a second wire bond having a first end is attached to the schottkey diode 22. The second end of the second wire bond is then attached to the bonding pad 24 of the semiconductor die 16.

It should be noted that this order of first attaching the wire bond from the external lead 20 to the schottkey diode 22 and then to the bonding pad 24 of the semiconductor die 16 is in reverse of the normal order. In the prior art, when a wire bond is used to attach the bonding pad 24 from the die 16 to the external lead 20, bond wires are first attached to the bonding pad 24 and then to the external lead 20. This is undesirable and can have a deleterious effect where the semiconductor die 16 does not have an ESD circuit designed therein. With the method of the present invention, the external lead is first attached to the schottkey diode 22. Then the connection from the schottkey diode 22 to the bonding pad 24 of the semiconductor die 16 is made. In so doing, any ESD disturbance caused by the act of soldering the wire from the schottkey diode 22 to the bonding pad 24 of the semiconductor die 16 can be absorbed by the schottkey diode 22.

Although a BGA-type package is disclosed in FIGS. 1A and 1B, any type of IC packaging may be used. Further, after the wire bonds have been attached, the device 10 is then packaged by having epoxy resin or ceramic either surround the sides or encapsulate the wire bonds or surround and encapsulate the entire structure. All of such packaging technique is well known in the art. Further, although the chip 16 is shown as being attached to the carrier 12 in a so-called "face up" configuration, i.e. the first and second bonding wires run along the side of the chip 16 and the side of the substrate 14, as will be seen, the method of the present invention is not so limited.

Figure 2A:
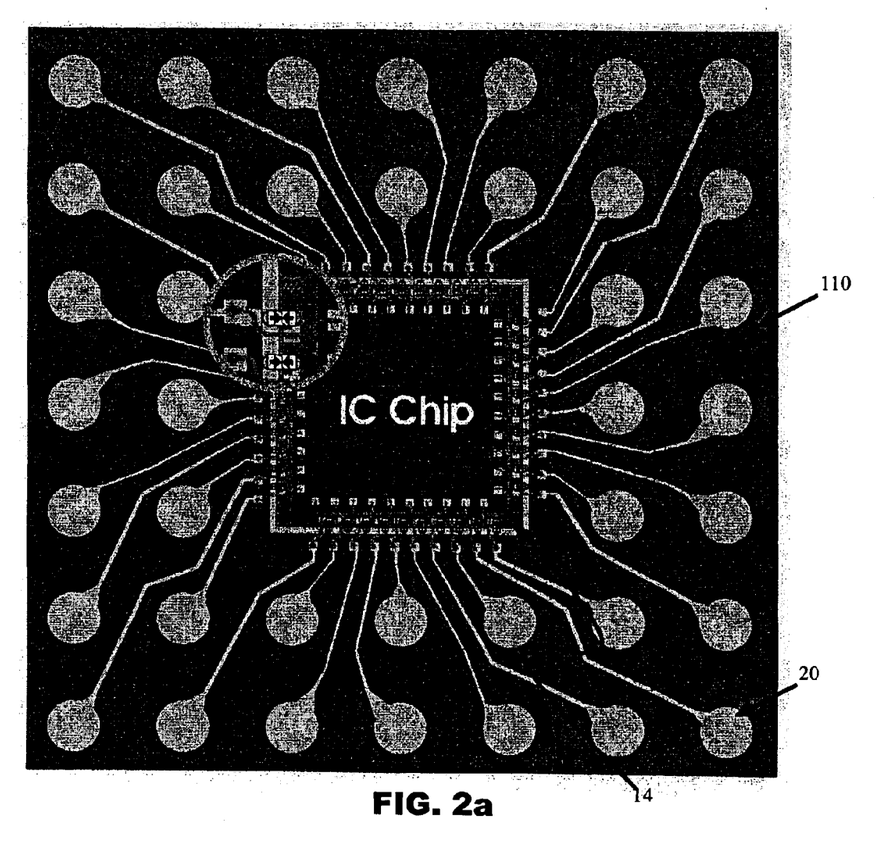
FIG. 2A is a top view of a second embodiment of an unpackaged semiconductor device manufactured by the method of the present invention, with FIG. 2B being a cross-sectional view of the device shown in FIG. 2A.
Figure 2B:
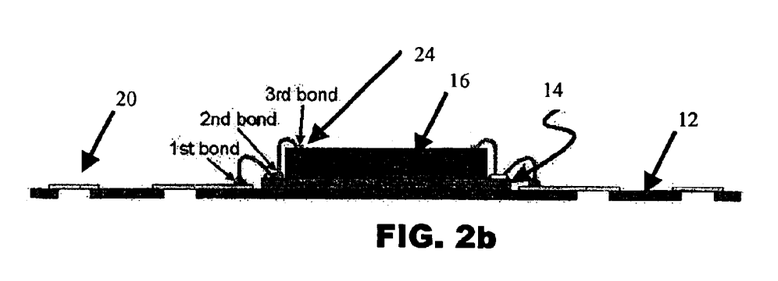

Referring to FIGS. 2A and 2B, there is shown a top and cross-sectional view, respectively, of a second embodiment of an unpackaged semiconductor device 110 made by the method of the present invention. In the device 110, shown in FIG. 2A, the device 110 comprises a chip carrier 12, with a plurality of external leads 20. The chip carrier 12, again, can be a BGA-type carrier, but the method of the present invention may be used with any type of carrier 12. A substrate 14 with discrete schottkey diodes 22 mounted thereon is mounted onto the chip carrier 12. In this embodiment, the schottkey diodes 22 are discrete devices bonded to the substrate as an assembly. The chip carrier 12 may be attached to the substrate 14 by die adhesive or the like. A semiconductor die 16 is mounted on the substrate 14. Again, the semiconductor die 16 can be of any type of integrated circuit, but without any ESD circuit thereon. The semiconductor die 16 can be attached to the substrate 14 by die adhesive.

Again, in the method of the present invention, a first bonding wire is used to bond the external lead 20 to the schottkey diode 22 on the substrate 14. A second bonding wire is provided with one end of the second bonding wire first attached to the schottkey diode 22 on the substrate 14, with the other end of the second wire then attached to the bonding pad 24 of the semiconductor die 16. Again, the wiring of the external lead 20 to the bonding pad 24 is done in reverse of the normal order, such that by the time the bonding wire is wired to the bonding pad 24 of the semiconductor die 16, the ESD circuit 22 will have already been electrically attached to the wire and can absorb any ESD disturbance caused during the bonding process.

Finally, after the device 110 has been bonded, it can be packaged by encapsulating just the bonding wires or encapsulating the entire structure, all in a manner well known in the art.

Figure 3A:
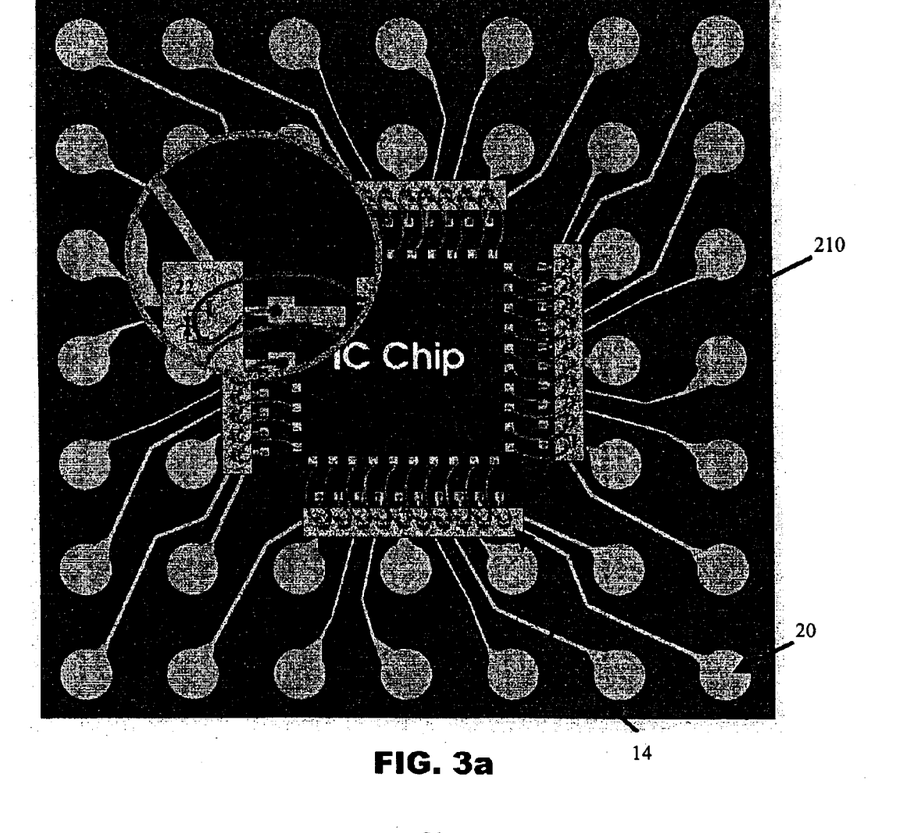
FIG. 3A is a top view of a third embodiment of an unpackaged semiconductor device manufactured by the method of the present invention, with FIG. 3B being a cross-sectional view of the device shown in FIG. 3A.
Figure 3B:
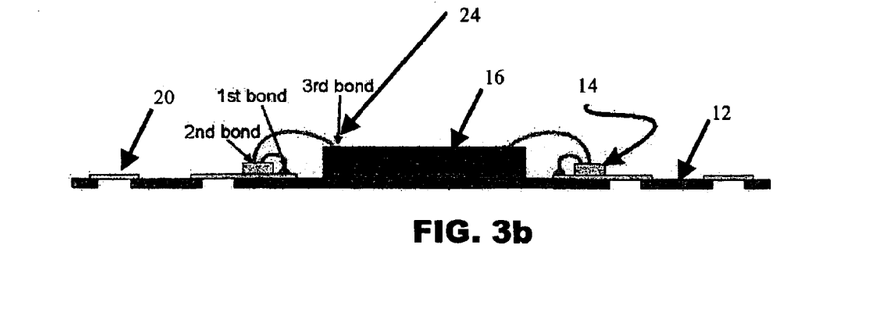

Referring to FIGS. 3A and 3B there is shown respectively the top and cross-sectional view of a third embodiment of a semiconductor device 210 made by the method of the present invention. In this device 210, again there is a chip carrier 12 having plurality of leads 20. The carrier 12, again, can be a BGA-type carrier or can be any type of carrier. A semiconductor die 16 having integrated circuits thereon but without any ESD circuit, is mounted directly on the chip carrier 12 substantially at the central portion thereof. This again can be done by using die adhesive to attach the semiconductor die 16 to the chip carrier 12. One or more strips 14 of glass or semiconductor substrate having schottkey diodes 22 fabricated or mounted thereon are placed adjacent to the semiconductor die 16 and on the chip carrier 12. Thus, unlike the embodiments shown in FIGS. 1 and 2, in the device 210, the semiconductor die 16 is not mounted directly on a glass or substrate 14 containing the schottkey diodes 22. Instead, the semiconductor die 16 is mounted directly on the chip carrier 12 and the glass or silicon substrate 14 with the schottkey diodes 22 are mounted on the chip carrier 12 along the periphery and spaced apart from the semiconductor die 16.

Again, the method of bonding the wires to the various components is as follows. A first bonding wire is used to attach the external lead 20 to the schottkey diode 22. A first end of the first bonding wire is first attached to the external lead 20. The other end of the bonding wire is attached to the schottkey diode 22. A second bonding wire has a first end that is then connected to the schottkey diode 22. The other end of the second wire is then used to bond to the bonding pad 24 of the semiconductor die 16.

Again, with the method of the present invention, any ESD disturbance that occurs during the bonding process can be absorbed by the ESD circuit or the schottkey diode 22. Finally, the device 210 can be packaged in the usual or well known manner of packaging.

Figure 4A:
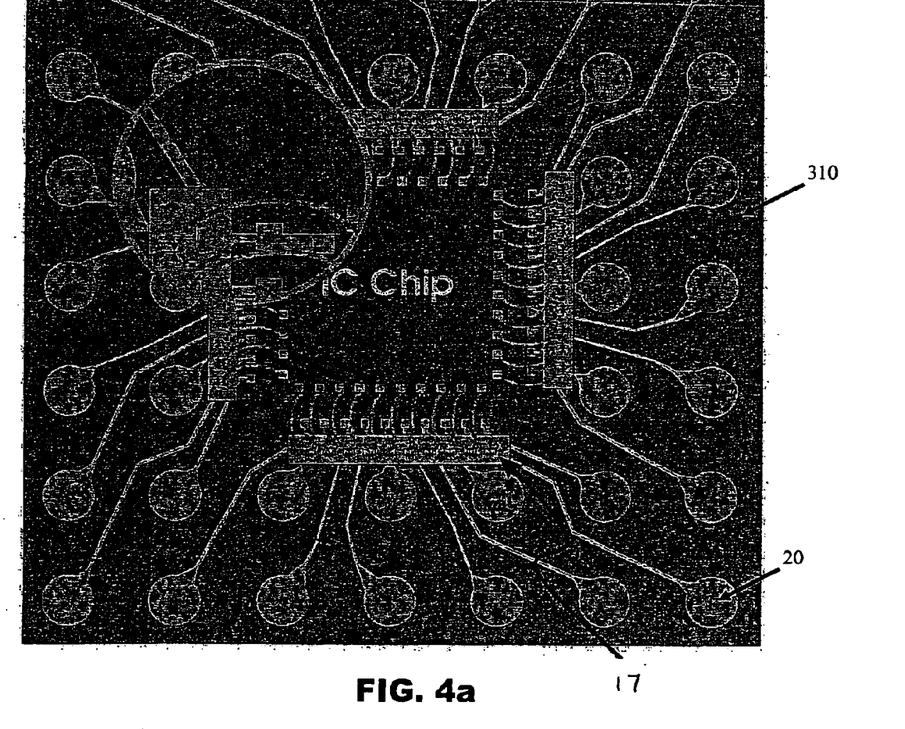
FIG. 4A is a top view of a fourth embodiment of an unpackaged semiconductor device manufactured by the method of the present invention, with FIG. 4B being a cross-sectional view of the device shown in FIG. 4A.
Figure 4B:
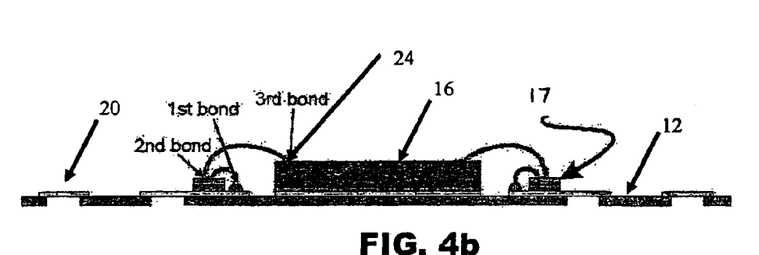

Referring to FIGS. 4A and 4B, there is shown a fourth embodiment of an unpackaged semiconductor device 310 made in accordance with the present invention. The device 310 comprises a chip carrier 12 having a plurality of external leads 20 thereon. A semiconductor die 16 without any ESD circuit, is mounted on the chip carrier 12 by, e.g., die adhesive attaching the die 16 directly to the carrier 12. A ring-shaped polymer having a plurality of schottkey diodes 22 mounted thereon, is also mounted directly on the chip carrier 12 by, e.g., die adhesive attaching the polymer ring 17 to the carrier 12. Similar to the aforementioned methods, in the method of bonding the device 310, a first bonding wire is first attached to the external lead 20. Thereafter it is attached to the schottkey diode 22 which is on the polymer ring 17. A second bonding wire is first attached to the schottkey diode 22 and thereafter is attached to the bonding pad 24 on the semiconductor die 16. The device 310 can then be packaged in the usual or well known manner.

Figure 5A:
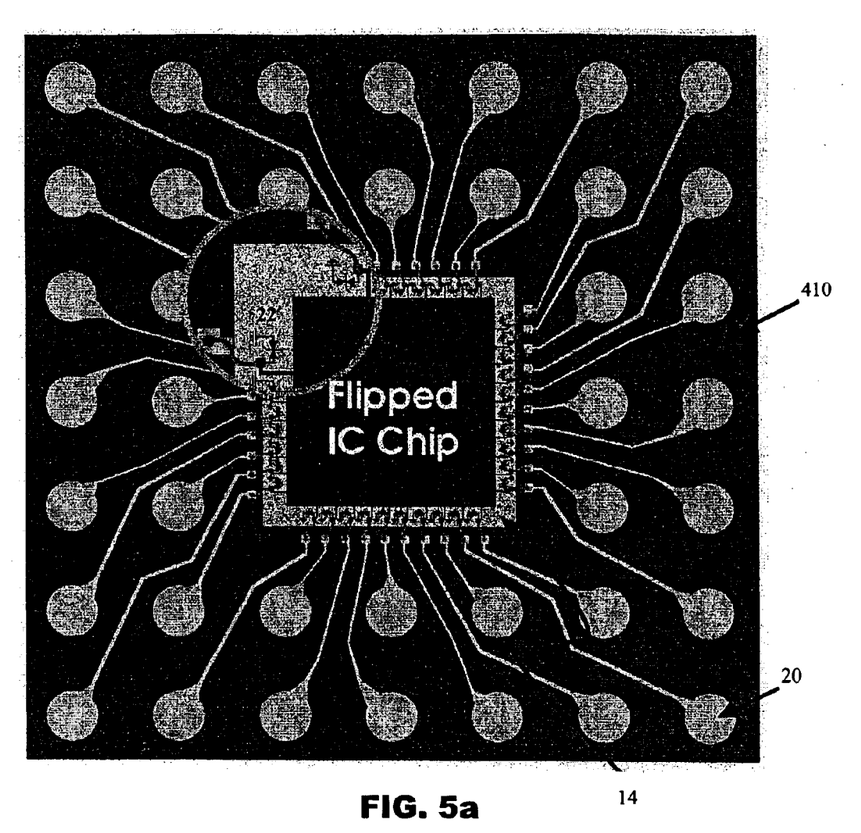
FIG. 5A is a top view of a fifth embodiment of an unpackaged semiconductor device manufactured by the method of the present invention, with FIG. 5B being a cross-sectional view of the device shown in FIG. 5A.
Figure 5B:
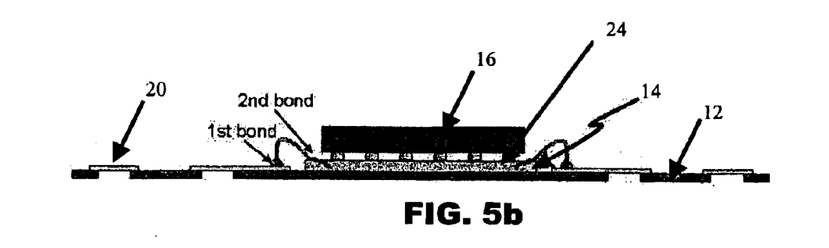

Referring to FIGS. 5A and 5B, there is shown a top and a cross-sectional view, respectively, of a fifth embodiment of an unpackaged semiconductor device 410 made by the method of the present invention. The device 410 is similar to the device 10 and 110 shown in FIGS. 1 and 2, respectively. However, unlike the devices 10 and 110, the semiconductor die 16 is a so-called "flipped IC chip" 16. In that regard, the bonding pads 24 of the die 16 are on a mounting surface which directly faces the substrate 14. Thus, the bonding pads 24 mount directly onto the substrate 14 which has interconnections through the substrate 14 to the schottkey diode 22.

In the method of the present invention, a first bonding wire is used to bond the external lead 20 to the schottkey diode 22 on the substrate 12. Once all the bonding wires have been attached from the external leads 20 to the schottkey diodes 22, the entire flip chip 16 is then mounted with its bonding pads 24 connected to the substrate 14. In that manner, electrical connection is then made between the schottkey diode 22 and the integrated circuit on the die 16. Finally, well known packaging techniques are used to package the device 410.

Figure 6A:
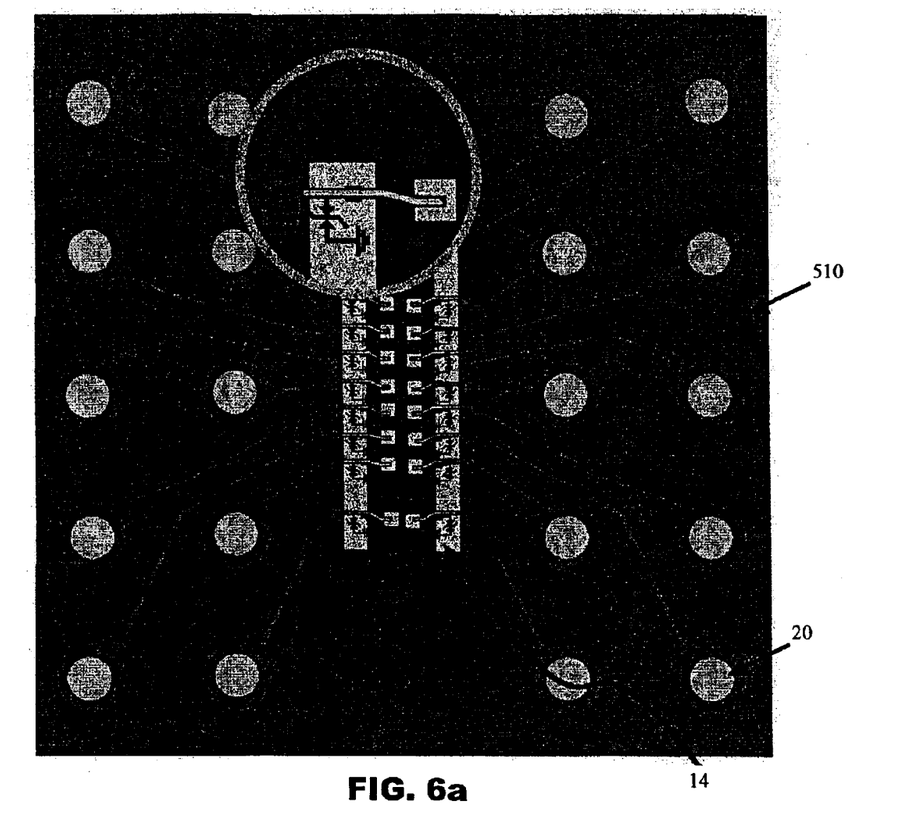
FIG. 6A is a top view of a sixth embodiment of an unpackaged semiconductor device of the present invention, also made by the method of the present invention, with FIG. 6B being a cross-sectional view of the device shown in FIG. 6A.
Figure 6B:
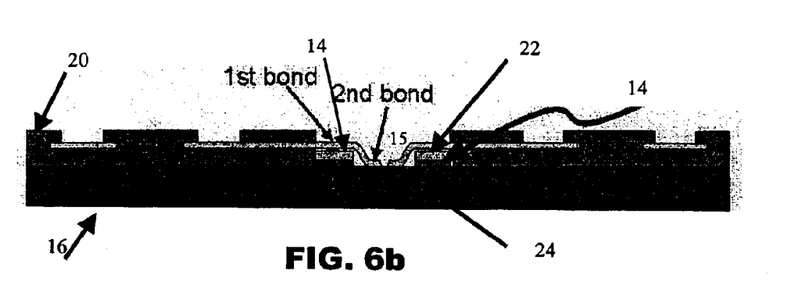

Referring to FIGS. 6A and 6B, there is shown a sixth embodiment of an unpackaged semiconductor device 510 of the present invention, made by the method of the present invention. In device 510, a chip carrier 12 has a plurality of external leads 20 on a first surface thereof. The chip carrier 12 also has a second surface opposite the first surface on which are mounted the external leads 20. The semiconductor die 16 has a mounting surface having the bonding pads 24 thereon. The mounting surface is mated to the second surface of the chip carrier 12. This is a well known "face down" structure. Between the first surface and the second surface of the chip carrier 12 is an aperture 15. The input/output bonding pads 24 of the semiconductor die 16 are substantially located in the middle of the rectangularly-shaped die 16 and the die 16 is positioned with respect to the chip carrier 12 such that the bonding pads 24 are positioned within the aperture 15. A strip of glass or silicon substrate containing a plurality of schottkey diodes 22 are mounted on the mounting surface of the die 16 and are also positioned within the aperture 15. Alternatively, the diodes 22 could be mounted and pre-attached to bond leads of the package substrate. The die 16 is typically a memory circuit, such as a DDR DRAM memory circuit, but without ESD circuit integrated therewith. A lead is then used to bond the external lead 20 to the schottkey diode 22 and to the bonding pad 24 of the semiconductor die 16. Thus, in the method of the present invention, a first bond is created between the external lead 20 and the schottkey diode 22. Thereafter, the same external lead is extended and is used to connect between the external lead 20 and the bonding pad 24 on the semiconductor die 16.

Thereafter, packaging can be completed by simply encapsulating the aperture 15 and/or additionally encapsulating the chip carrier 12 and the die 16 together.

Figure 7A:
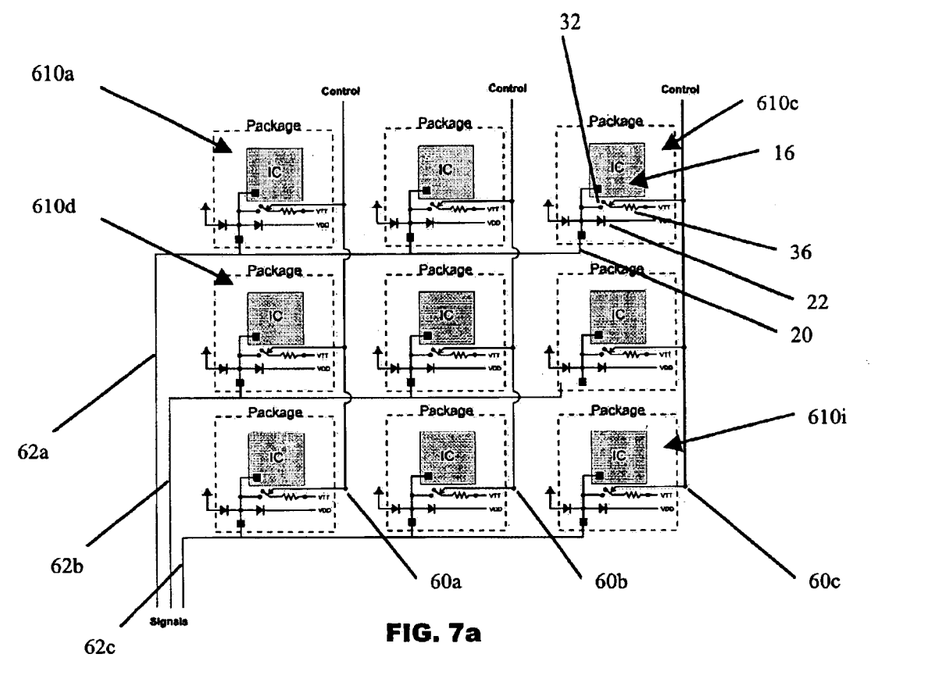
FIGS. 7a & 7b are schematic circuit diagrams of a plurality of semiconductor devices of the present invention each packaged with a terminating resistor switchably connectable by a control signal.

Referring to FIG. 7a there is shown a schematic diagram of a plurality of packaged integrated circuit semiconductor devices 610(a–i) of the present invention. The nine devices 610(a–i) are arranged in a plurality of rows and columns. A plurality of control signals 60(a–c) access each device 610 in the same column. Each device 610 comprises a semiconductor die 16 without an ESD circuit integrated therewith. In the preferred embodiment, the integrated circuit die 16 is a DDR (DRAM) memory device. However, the present invention is not so limited and can be any type of device that requires operation at a high transmission rate. The die 16 is packaged along with a separate ESD circuit 22, such as a schottkey diode 22, in a package 30, in the manner described heretofore. The package 30 receives an external lead 20 and is connected to the schottkey diode 22 and to the bonding pad 24 of the die 16. In addition, however, the device 610 also comprises a terminating resistor 36 which is switchably connected by switch 32 to the external lead 20 and to the bonding pad 24. The terminating resistor 36 can be made of a thin film resistor and can be very precise. In a preferred embodiment, the terminating resistor 36 has 50Ω resistance (or any other amount of resistance). The switch 32 can be controlled by the control signal 60 supplied along the column line. Therefore, the switch 32 can be a transistor which can be electrically activated. Alternatively, the switch 32 can be a fuse which can be blown or not blown and thereby "permanently" connect or disconnect the resistor 36 to the external lead 20. The external leads 20 to each device 610 in the same row are all connected to the same row signal line 62.

With the device 610 of the present invention, if it is desired to operate the device 610 in a high performance mode, i.e., at a high frequency, the control signal 60 is selected to activate the switch 32 connecting the terminating resistor 36 to the external lead 20. In that event, signals supplied along the external lead 20 will have a 50Ω terminating resistance (or any other amount of resistance) which is typically the matched impedance for high frequency operation. This would be in the event the integrated circuit within the die 16 can be operated at such high frequency. At the same time, the schottkey diode 22 performs the function of ESD protection for the circuit of the die 16.

Alternatively, if the IC in the die 16 is deemed to be of "low quality" and is not able to perform at high frequency, then the control signal 60 may be used to deactivate the switch 32 thereby disconnecting the terminating resistor 36 from the external lead 20. Thus, with the device 610 of the present invention, the same circuit on the die 16 may be fabricated through the same fabrication line and only during the wafer sort can the "high/low" performance dies be selected. Thus, there need not be separate inventories kept for different performance IC dies 16.

Figure 7B:
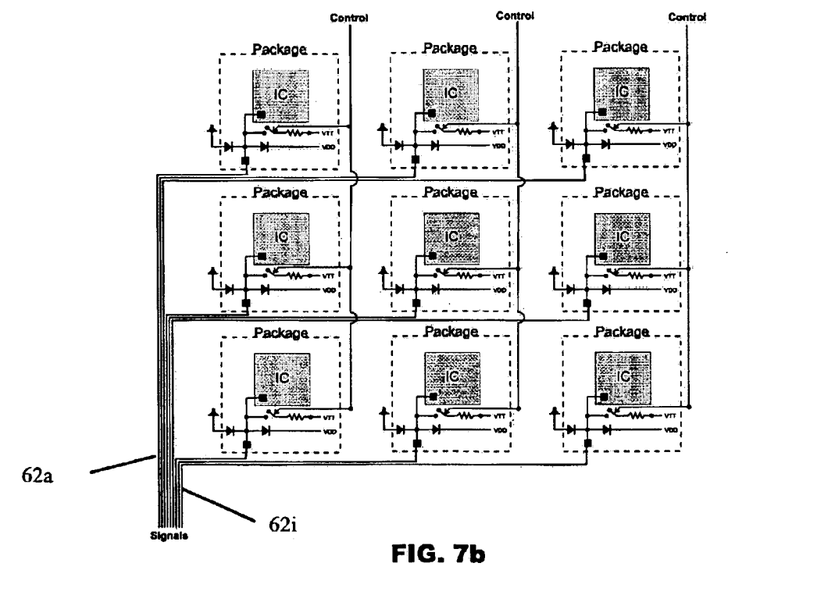

Referring to FIG. 7b, there is shown a schematic circuit drawing of another embodiment of a plurality of packaged devices 610 of the present invention. Similar to the devices 610 shown in FIG. 7a, the devices 610 shown in FIG. 7b are arranged in a plurality of rows and columns. The only difference between the embodiment shown in FIG. 7b and that shown in FIG. 7a is that the external lead 20 for each device 610 is individually supplied with the signal supplied on signal line 62(a–i), and is not supplied in common to the same row.

Figure 8A:
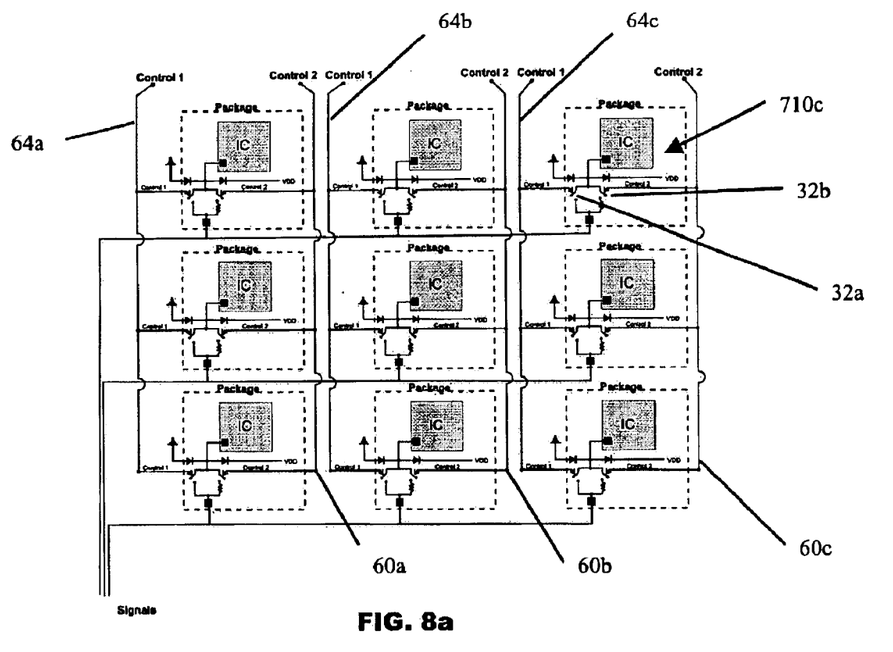
FIGS. 8a & 8b are schematic circuit diagrams of a plurality of semiconductor devices of the present invention, each packaged with a series resistor switchably connectable by a first control signal and a second control signal.

Referring to FIG. 8a there is shown a schematic circuit drawing of a plurality of packaged integrated circuit semiconductor devices 710(a–i) of the present invention. The nine devices 710(a–i) are arranged in a plurality of rows and columns. A plurality of control signals 60(a–c) access each device 710 in the same column. Each device 710 comprises a semiconductor die 16 without an ESD circuit integrated therewith. In the preferred embodiment, the integrated circuit die 16 is a DDR (DRAM) memory device. However, the present invention is not so limited and can be any type of device that requires operation at a high transmission rate. The die 16 is packaged along with a separate ESD circuit 22, such as a schottkey diode 22, in a package 30, in the manner described heretofore. The package 30 receives an external lead 20 and is connected to the schottkey diode 22 and to the bonding pad 24 (not shown) of the die 16. In addition, however, the device 710 also comprises a resistor 36, connected in series with the external lead 20, and which is switchably connected by switch 32b to the bonding pad 24. The resistor 36 can be made of a thin film resistor and can be very precise. In a preferred embodiment, the resistor 36 has 50Ω resistance. The switch 32b can be controlled by the control signal 60c supplied along the column line. Therefore, the switch 32b can be a transistor which can be electrically activated. In addition, the external lead 20 is supplied along a parallel path to a second switch 32a, which is activated by a signal from the control line 64c. If the switch 32a is activated, the signal from the external lead 20 is supplied directly to the bonding pad 24. The external leads 20 to each device 710 in the same row are all connected to the same row signal line 62.

Figure 8B:
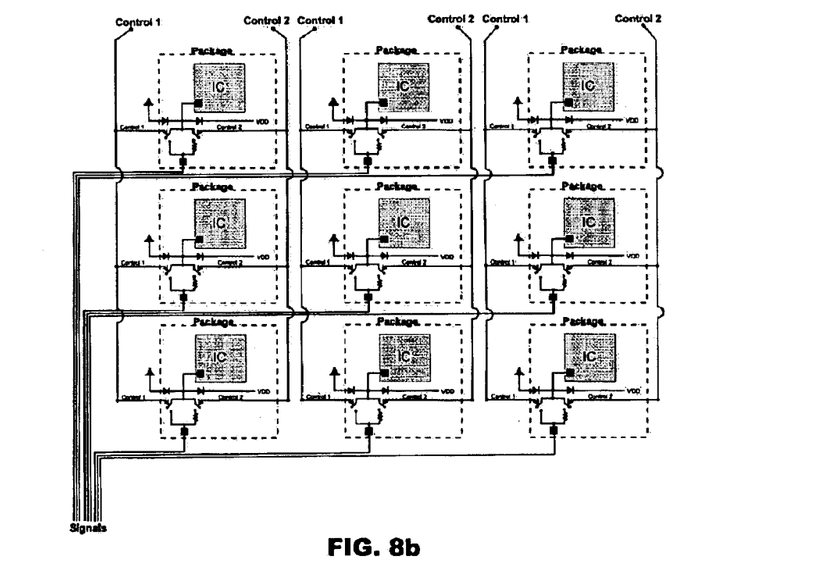

Referring to FIG. 8b, there is shown a schematic circuit drawing of another embodiment of a plurality of packaged devices 710 of the present invention. Similar to the devices 710 shown in FIG. 8a, the devices 710 shown in FIG. 8b are arranged in a plurality of rows and columns. The only difference between the embodiment shown in FIG. 8b and that shown in FIG. 8a is that the external lead 20 for each device 710 is individually supplied with the signal supplied on signal line 62(a–i), and is not supplied in common to the same row.

What is claimed is:

1. A method of bonding a semiconductor die without an ESD circuit and a separate ESD circuit to an external lead, said method comprising:
   bonding said external lead to said separate ESD circuit;
   then bonding said separate ESD circuit to said semiconductor die;
   packaging said die and said circuit in a single package, wherein said external lead is bonded to said ESD circuit and to said semiconductor die
   coupling the package to a chip carrier, said carrier having a first surface having said external lead, and a second surface opposite said first surface and an aperture between said first surface and said second surface
   said semiconductor die having a mounting surface with a mounting pad thereon;
   said mounting surface facing said second surface with said mounting pad in said aperture;
   said ESD circuit on said mounting surface in said aperture;
   wherein said external lead is bonded to said ESD circuit in said aperture and to said mounting pad in said aperture; and
   wherein said semiconductor die is a memory die, said die being substantially rectilinear in share with a plurality of rows having a plurality of mounting pads thereon substantially in the middle of said rectilinear shape.

2. The method of claim 1, wherein a plurality of ESD circuits are mounted on a strip.

3. The method of claim 2 further comprising mounting said strip of ESD circuits to said mounting surface of said semiconductor die, adjacent to said plurality of mounting pads prior to bonding an external lead to one of said ESD circuits.

4. A semiconductor device comprising:
   a chip carrier having a first surface having a plurality of leads, and a second surface opposite said first surface and an aperture between said first surface and said second surface;
   a semiconductor die having a mounting surface with a mounting pad thereon, wherein said die is substantially rectilinearly shaped with a plurality of rows of mounting pads substantially in the middle of said die;
   said mounting surface facing said second surface with said mounting pad in said aperture;
   an ESD circuit on said mounting surface in said aperture;
   a first electrical connector connecting one of said plurality of leads to said ESD circuit; and
   a second electrical connector connecting said ESD circuit to said mounting pad, wherein said first electrical connector and said second electrical connector are the same connector.

5. The semiconductor device claim 4 further comprising:
   a die adhesive for attaching said semiconductor die to said chip carrier; and
   a package for encapsulating said ESD circuit and said aperture.

6. The semiconductor device of claim 5 wherein said package further encapsulates said die with said chip carrier.

7. The semiconductor device of claim 4 further comprising a plurality of ESD circuits, each mounted on said mounting surface with each ESD circuit substantially adjacent to a mounting pad in said aperture.

8. A method of assembling a semiconductor device, said device including a semiconductor die having an integrated circuit with a plurality of rows of mounting pads connecting to said integrated circuit, on a mounting surface, said method comprising:
   mounting a strip on said mounting surface, substantially adjacent to said plurality of rows of mounting pads, said strip having a plurality of ESD circuits;
   bonding an external lead to one of said ESD circuits; and
   then bonding one of said ESD circuits having said external lead bonded, to one of said mounting pads.

9. The method of claim 8 further comprising the step of:
   mounting said semiconductor die on a chip carrier, said chip carrier having a first surface with a plurality of external leads, a second surface, opposite said first surface, and an aperture between said first surface and said second surface; said die mounted with said mounting surface facing said second surface and said mounting pads in said aperture.

10. The method of claim 9 wherein said semiconductor die is mounted on said chip carrier before said strip is mounted on said die.

11. The method of claim 9 wherein said semiconductor die with said strip mounted thereon is mounted on said chip carrier with said ESD circuits in said aperture.

12. The method of claim 9 wherein said external lead is bonded to one of said ESD circuits and said same external lead is bonded to one of said mounting pads.

13. The method of claim 4 wherein said integrated circuit is a circuit.

14. A semiconductor device comprising:
  a semiconductor die having an input pad for receiving an input signal;
  an ESD circuit electrically connected to said input pad;
  a terminating resistor switchably connected to said input pad;
  said ESD circuit and said resistor external to said die;
  said ESD circuit, said resistor and said die packaged in a single package; and
  an external lead connected to said input pad.

15. The device claim 14 wherein said resistor is switchably connected to said input pad in response to a control signal.

16. The device of claim 14 wherein said resistor is switchably connected to said input pad through a fuse.

17. The device of claim 14 wherein said terminating resistor is made of thin film.

18. The device of claim 14 wherein said semiconductor die is a memory circuit.

19. The device of claim 18 wherein said memory circuit is a DRAM, double data rate (DDR) circuit.

20. The device of claim 19 wherein said resistor is switchably connected to said input pad in response to the performance of said DDR circuit.

* * * * *

UNITED STATES PATENT AND TRADEMARK OFFICE
CERTIFICATE OF CORRECTION

PATENT NO. : 6,933,610 B2  Page 1 of 1
APPLICATION NO. : 10/370422
DATED : August 23, 2005
INVENTOR(S) : Segaram et al.

It is certified that error appears in the above-identified patent and that said Letters Patent is hereby corrected as shown below:

In the Claims:

Claim 1, Column 7, line 64 replace "rectilinear in share" with --rectilinear in shape--
Clailm 5, Column 8, line 26 replace "device claim 4 further" with --device of claim 4 further--
Claim 13, Column 8, line 66, replace "is a circuit." with --is a memory circuit.--
Claim 15, Column 9, line 11 replace "The device claim 14" with --The device of claim 14--

Signed and Sealed this

Fifth Day of September, 2006

JON W. DUDAS
*Director of the United States Patent and Trademark Office*